(12) United States Patent
Takeuchi et al.

(10) Patent No.: US 11,621,216 B2
(45) Date of Patent: Apr. 4, 2023

(54) SEMICONDUCTOR MODULE

(71) Applicant: Mitsubishi Electric Corporation, Tokyo (JP)

(72) Inventors: Kensuke Takeuchi, Tokyo (JP); Masayuki Funakoshi, Tokyo (JP); Takashi Nagao, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/056,505

(22) PCT Filed: Aug. 20, 2018

(86) PCT No.: PCT/JP2018/030620
§ 371 (c)(1),
(2) Date: Nov. 18, 2020

(87) PCT Pub. No.: WO2020/039466
PCT Pub. Date: Feb. 27, 2020

(65) Prior Publication Data
US 2021/0217687 A1    Jul. 15, 2021

(51) Int. Cl.
*H01L 23/495* (2006.01)
*H01L 23/31* (2006.01)
(Continued)

(52) U.S. Cl.
CPC .... *H01L 23/49562* (2013.01); *H01L 23/3107* (2013.01); *H01L 23/49524* (2013.01);
(Continued)

(58) Field of Classification Search
None
See application file for complete search history.

(56) References Cited

U.S. PATENT DOCUMENTS 6,362,517 B1 * 3/2002 Bell ............... H01L 23/3107
257/666
2012/0326289 A1   12/2012 Minamio
(Continued)

FOREIGN PATENT DOCUMENTS

JP    51-060449 A    5/1976
JP    63-128745 U    8/1988
(Continued)

OTHER PUBLICATIONS

Extended European Search Report dated Jul. 5, 2021 in European Application No. 18931121.0.
(Continued)

*Primary Examiner* — Michelle Mandala
*Assistant Examiner* — Jordan M Klein
(74) *Attorney, Agent, or Firm* — Sughrue Mion, PLLC; Richard C. Turner

(57) ABSTRACT

A semiconductor module includes a semiconductor switching element, a multiple of bases, on at least one of which the semiconductor switching element is mounted, a molded resin that seals the semiconductor switching element and the multiple of bases, a multiple of terminals formed integrally with each one of the multiple of bases and provided extending from an outer periphery side face of the molded resin, and a recessed portion or a protruding portion having a depth or a height such that creepage distance between the multiple of terminals is secured, and formed so as to cross an interval between the multiple of terminals, in one portion of the outer periphery side face of the molded resin between the multiple of terminals.

18 Claims, 7 Drawing Sheets

(51) Int. Cl.
 *H01L 23/00* (2006.01)
 *H01L 25/07* (2006.01)
(52) U.S. Cl.
 CPC ........ *H01L 23/49575* (2013.01); *H01L 24/40* (2013.01); *H01L 24/48* (2013.01); *H01L 25/072* (2013.01); *H01L 2224/40177* (2013.01); *H01L 2224/48177* (2013.01); *H01L 2924/182* (2013.01)

(56) References Cited

U.S. PATENT DOCUMENTS

| | | | | |
|---|---|---|---|---|
| 2014/0021638 | A1* | 1/2014 | Mahler | H01L 23/5389 257/777 |
| 2015/0162274 | A1* | 6/2015 | Kadoguchi | H01L 23/047 257/694 |
| 2015/0171000 | A1* | 6/2015 | Niu | H01L 23/3107 257/676 |
| 2016/0315037 | A1* | 10/2016 | Kadoguchi | H01L 23/49568 |
| 2016/0365296 | A1* | 12/2016 | Otremba | H01L 23/36 |
| 2018/0040542 | A1* | 2/2018 | Kadoguchi | H01L 21/565 |

FOREIGN PATENT DOCUMENTS

| | | |
|---|---|---|
| JP | 1-113346 U | 7/1989 |
| JP | 08-97333 A | 4/1996 |
| JP | 63-153850 A | 6/1998 |
| JP | 2018-022837 A | 2/2018 |

OTHER PUBLICATIONS

International Search Report for PCT/JP2018/030620, dated Oct. 16, 2018.

Communication dated Jan. 5, 2022 from the Japanese Patent Office in Application No. 2020-537902.

* cited by examiner

SEMICONDUCTOR MODULE

CROSS REFERENCE TO RELATED APPLICATIONS

This application is a National Stage of International Application No. PCT/JP2018/030620 filed Aug. 20, 2018.

TECHNICAL FIELD

The present application relates to a semiconductor module.

BACKGROUND ART

An existing semiconductor module package is such that an uneven form is adopted for a region between terminals protruded from an outer periphery of the package as a tracking countermeasure, whereby a creepage distance between the terminals is formed to be long. For example, an IC package of an existing semiconductor module disclosed in Patent Literature 1 is such that a stepped form that provides unevenness over a whole of a side face of the IC package is adopted, and an external lead is configured by being led out in a zigzag array from a recessed portion and a protruding portion of an external form of the package, whereby the creepage distance between terminals is lengthened.

CITATION LIST

Patent Literature

Patent Literature 1: JP-UM-A-1-113346

SUMMARY OF INVENTION

Technical Problem

However, the semiconductor module IC package disclosed in the previously described Patent Literature 1 is such that neighboring packages have differing external forms and terminals, and there is a problem in that a mold of a package molded using resin is fabricated in a complex form, and machining is complex. Also, when releasing from the mold, a face at which the mold and the resin are in contact is large, because of which there is a problem in that resin peeling occurs, and reliability of the semiconductor module is lost.

The present application has been made to solve the above problem and an object of the present application is to provide a semiconductor module such that molded resin machining is simplified and reliability is increased, while securing a creepage distance between terminals.

Solution to Problem

A semiconductor module disclosed in the present application includes a semiconductor switching element, a multiple of bases, on at least one of which the semiconductor switching element is mounted, a molded resin that seals the semiconductor switching element and the multiple of bases, a multiple of terminals formed integrally with each one of the multiple of bases and provided extending from an outer periphery side face of the molded resin, and a recessed portion or a protruding portion having a depth or a height such that creepage distance between the multiple of terminals is secured, and formed so as to cross an interval between the multiple of terminals, in one portion of the outer periphery side face of the molded resin between the multiple of terminals.

Advantageous Effects of Invention

The semiconductor module disclosed in the present application implements a semiconductor module such that molded resin machining can be simplified and reliability can be increased, while securing a creepage distance between terminals.

DESCRIPTION OF EMBODIMENTS

Figure 1:
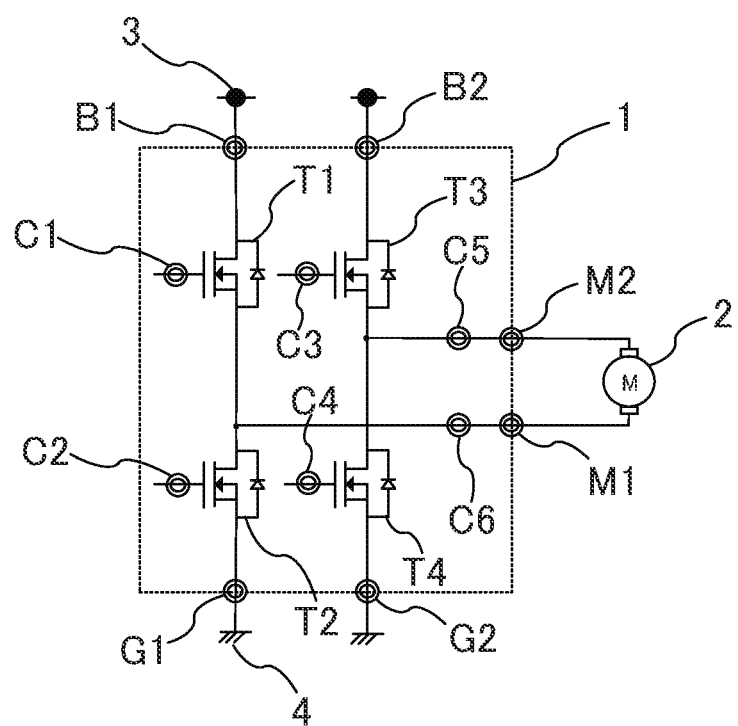
FIG. 1 is a circuit diagram showing a semiconductor module according to a first embodiment.

Hereafter, a semiconductor module according to a first embodiment will be described, based on the drawings.

In the drawings, identical reference signs indicate identical or corresponding portions.

First Embodiment

FIG. 1 is a circuit diagram showing a semiconductor module according to the first embodiment. A semiconductor module 1 incorporates at least one of a multiple of semiconductor switching elements T1 to T4. FIG. 1 shows an H-bridge circuit that drives a motor 2, and the semiconductor module 1 includes the motor 2, a positive (+) power supply 3, and a ground 4. In FIG. 1, double circles indicate terminals C1 to C6, B1, B2, G1, G2, M1, and M2. The semiconductor switching elements T1 to T4 are, for example, field effect transistors (FETs). As shown in FIG. 1, the semiconductor module 1 is such that a bridge circuit is configured of four FETs, and the motor 2 is connected to the small signal terminal C5 and terminal C6, which are upper and lower arm intermediate connection positions, and to the large current terminal M1 and terminal M2.

Also, the small signal terminals C1, C2, C3, and C4 are FET gate drive control signal terminals, and the small signal terminals C5 and C6 are terminals that monitor voltage of the motor 2. The large current terminal B1 and terminal B2 are connected to the positive (+) power supply 3, and the large current terminal G1 and terminal G2 are connected to the ground 4. Terminals that output to the motor 2 are the large current terminal M1 and terminal M2.

Figure 2A:
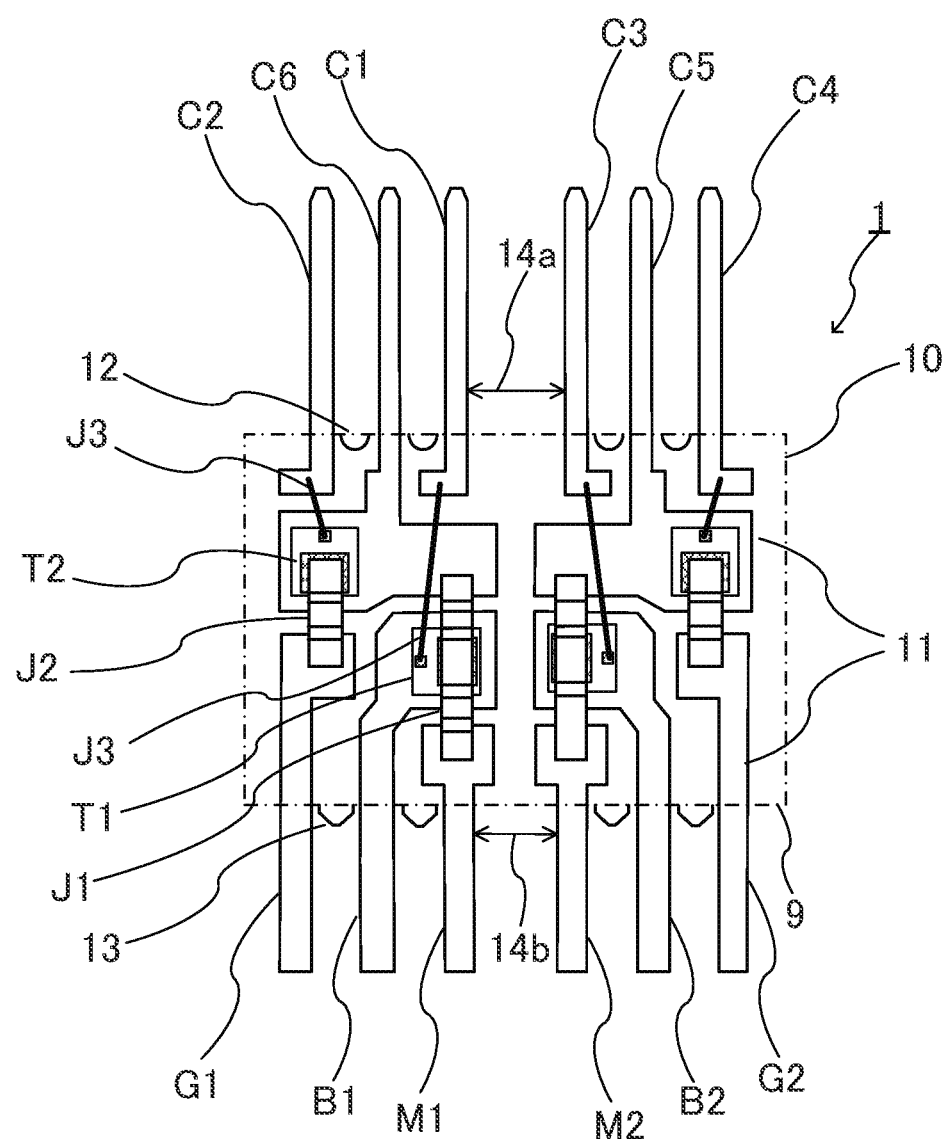
FIG. 2A is a plan view showing an internal configuration of the semiconductor module according to the first embodiment.

FIG. 2A is a plan view showing an internal configuration of the semiconductor module according to the first embodiment, wherein the circuit configuration shown in FIG. 1 is formed as the semiconductor module 1. Also, the semiconductor module 1 is shown as being transparent in FIG. 2A, and an external form of a molded resin 10 is indicated by a dash-dotted line. For example, a plate-form base 11 of copper or a copper alloy is divided into a multiple of patterns. The terminals C1 to C6, B1, B2, G1, G2, M1, and M2 are formed integrally with each one of the multiple of bases 11, and the semiconductor switching elements T1 to T4 are formed mounted on the base 11. The large current terminals G1, B1, M1, M2, B2, and G2 and the small signal terminals C2, C6, C1, C3, C5, and C4 provided extended from the base 11 and protruding are formed in an outer periphery 9 side face of the molded resin 10 of the semiconductor module 1. As shown in FIG. 2A, the large current terminals G1, B1, M1, M2, B2, and G2 are arrayed on a central lower side of the drawing, and the small signal terminals C2, C6, C1, C3, C5, and C4 are arrayed in order on a central upper side of the drawing.

As shown in FIG. 1, the H-bridge circuit is such that FETs are connected in series in upper and lower arms, and are configured of pairs, because of which the dispositions in FIG. 2A are also dispositions that are the same left and right, that is, there is a mirror disposition. Because of this, only one of the dispositions and the connections will be described.

As shown in FIG. 2A, the copper plate base 11 extends into an interior of the semiconductor module 1 from the large current terminal B1, and the FET that is the semiconductor switching element T1 is mounted thereon. A gate (not shown) of the FET that is the semiconductor switching element T1 is connected to the small signal terminal C1 using a wire J3 formed by wire bonding. The copper plate base 11 is directly connected to a drain (not shown) of the FET that is the semiconductor switching element T1, while a source (not shown) is electrically wired using a jumper wire J1. In the same way as the copper plate base 11, the jumper wire J1 is formed in a copper plate form, and not only allows a large current to flow, but also has excellent heat conductivity.

One jumper wire J1 (on the central lower side of the drawing) is connected to a separate base 11, and this is connected to the large current terminal M1, which is a terminal for output to the motor 2. Another jumper wire J1 (on the central upper side of the drawing) is connected to the base 11 of the FET that is the semiconductor switching element T2 of the lower arm. In the same way as the FET that is the semiconductor switching element T1, the FET that is the semiconductor switching element T2 is such that a gate is connected to the small signal terminal C2 using the wire J3 formed by wire bonding, and a source is connected via a jumper wire J2 to the large current terminal G1, which is a ground terminal.

As heretofore described, the semiconductor module 1 according to the first embodiment is such that after the semiconductor switching elements T1, T2, T3, and T4, the base 11, the jumper wires J1 and J2, and the like are disposed and connected, the whole thereof is covered and sealed with the molded resin 10 indicated by the dash-dotted line.

The semiconductor module 1 is such that the semiconductor switching elements T1 to T4 are driven so as to be turned on and off, and a comparatively large current is controlled. Specifically, the large current terminals G1, B1, M1, M2, B2, and G2 conduct a maximum of in the region of 100A. Also, the small signal terminals C1 to C6 are such that a signal of a relatively small current is controlled, and several milliamps or less are conducted.

The terminals C1 to C6, B1, B2, G1, G2, M1, and M2 are arrayed in proximity in order to reduce the size of the whole device, that is, the semiconductor module 1. Also, depending on an environment in which the semiconductor module 1, which is the device, is installed, or a material, a coating, or the like of the molded resin 10, there is a possibility of tracking occurring, and a securing of insulation affects not only a normal drive of the semiconductor module 1, which is the device, but also the reliability of the whole of a device including the semiconductor module 1, for example, a power conversion device.

Because of this, securing creepage distance in the semiconductor module 1 of the first embodiment is necessary, but taking too great a distance causes an impediment to reducing the size of the device. Creepage distance is generally prescribed in accordance with the material, a degree of contamination, and the like, but operating voltage is particularly important, and when the device is mounted in, for example, a vehicle, the voltage is normally a battery voltage of 14V, meaning that the voltage is comparatively low, because of which a creepage distance of in the region of 1 mm is sufficient. However, the voltage is a high voltage of in the region of 350V in an electric vehicle, because of which, assuming that the operating voltage is also 350V, a creepage distance of in the region of 3 mm is needed.

Furthermore, as the creepage distance is the shortest distance at which terminals are opposed along the molded resin 10, which is an insulating resin, a position of opposing a neighboring terminal, a thickness and a width of a terminal itself, and a distance between corresponding terminal sides also need to be considered. According to the semiconductor module 1 according to the first embodiment, a recessed portion 12 or a protruding portion 13 is provided in one portion of the outer periphery 9 of the semiconductor module 1 between terminals. Because of this, the shortest distance between terminals is extended by an uneven face.

As shown in FIG. 2A, the small signal terminals C1, C6, and C2 are provided in the outer periphery 9 of the molded resin 10 on the central upper side of the drawing, and the recessed portion 12 is provided in the outer periphery 9 between the small signal terminals C1, C6, and C2. Meanwhile, the large current terminals M1, B1, and G1 are provided in the outer periphery 9 of the molded resin 10 on the central lower side of the drawing, and the protruding portion 13 is provided on the outer periphery 9 between the large current terminals M1, B1, and G1. As shown in FIG. 2A, the shortest distance between terminals is the outer periphery 9 indicated by a dash-dotted line when the recessed portion 12 and the protruding portion 13 are not formed, but by the recessed portion 12 and the protruding portion 13 being provided, distance along the outer periphery 9 can be arbitrarily earned using a depth of the recessed portion 12 or a height of the protruding portion 13. Also, there is a gap, and therefore no contact, between the multiple of terminals C1, C6, and C2 and the recessed portion 12, and between the multiple of terminals M1, B1, and G1 and the protruding portion 13.

Figure 2B:
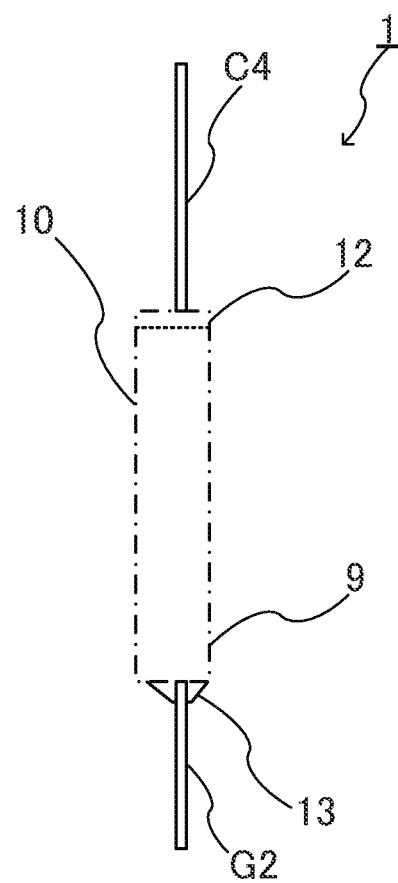
FIG. 2B is a side view of the semiconductor module according to the first embodiment.

A space 14a between the small signal terminal C1 and terminal C3 and a space 14b between the large current terminals M1 and M2 are wide because a length between the terminals is large, because of which creepage distance is secured, meaning that the recessed portion 12 and the protruding portion 13 need not be provided. FIG. 2B is a side view of the semiconductor module according to the first embodiment. As shown in FIG. 2B, a form of the protruding portion 13 is a raised form (also including a trapezoid) formed in a direction of extension of the terminal G2. Also, the protruding portion 13 need not be formed over a whole of the side face of the outer periphery 9 of the molded resin 10 in the semiconductor module 1. Further still, a configuration wherein the protruding portion 13 is provided between the small signal terminals C1 to C6 and the recessed portion 12 is provided between the large current terminals G1, B1, M1, M2, B2, and G2 may be adopted, or a configuration wherein one kind, either the recessed portion 12 or the protruding portion 13, is provided may be adopted.

Figure 3:
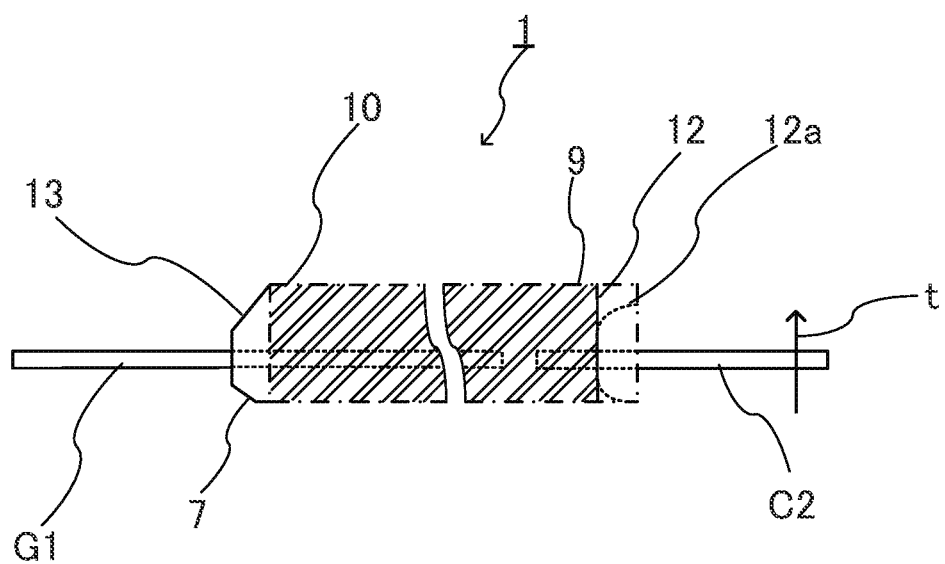
FIG. 3 is a partial detailed view of the semiconductor module according to the first embodiment.

Next, an uneven portion will be described in further detail, using FIG. 3 and FIG. 4. FIG. 3 is a partial detailed view of the semiconductor module according to the first embodiment. FIG. 3 is a sectional view of C2 to G1 seen from the terminals C6 to B1 of the semiconductor module 1 shown in FIG. 2A, wherein a dash-dotted line indicates the outer periphery 9 of the semiconductor module 1.

In the semiconductor module 1 according to the first embodiment, the recessed portion 12 provided in a vicinity of the small signal terminal C2 is bored in an approximately semi-circular form out of the outer periphery 9. Meanwhile, the protruding portion 13 is formed protruding in a direction of extension of the terminal G1, and is of a trapezoidal form. As the creepage distance is the shortest distance between terminal end portions, the protruding portion 13 in the semiconductor module 1 of the first embodiment is such that portions opposing a thickness direction t of the large current terminal G1 are highest, and the protruding portion 13 becomes gradually lower while becoming distanced from the thickness direction t of the terminal. That is, a protruding height of the protruding portion 13 can also be caused to vary in accordance with a length of an interval 8 between terminals.

The protruding portion 13 is disposed so as to cross the interval 8 between terminals, and the height thereof is varied so that creepage distance can be secured. In the same way, the recessed portion 12 is also such that the thickness direction of the terminal C2, that is, the interval 8 between terminals, is deepest, and the recessed portion 12 can also be formed shallower while becoming distanced from the thickness direction t, as shown by a broken line 12a. Also, as a consequence of the recessed portion 12 or the protruding portion 13 being provided, a spatial distance of the interval 8 between terminals can be extended, because of which there is not only an advantage of preventing tracking, but also of preventing an electrical discharge from a terminal.

Figure 4:
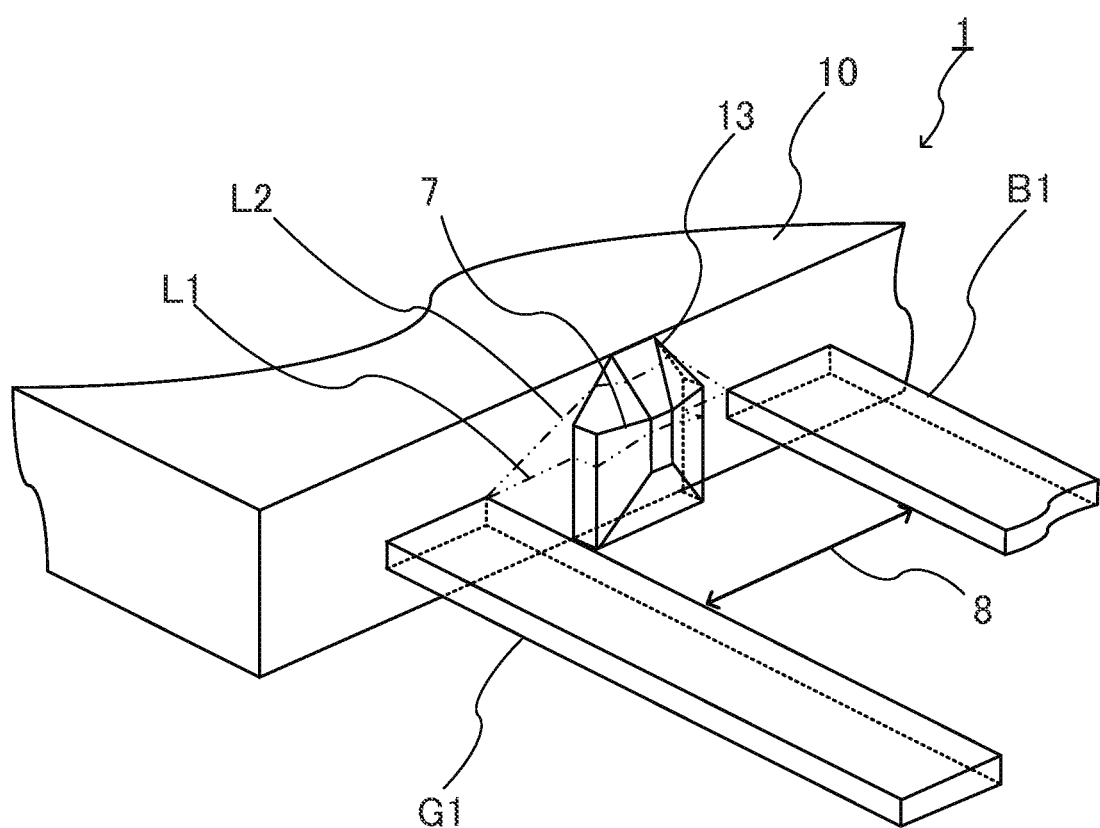
FIG. 4 is a partial detailed view of the semiconductor module according to the first embodiment.

FIG. 4, being a partial detailed view of the semiconductor module according to the first embodiment, is a perspective enlarged view showing the protruding portion 13 partially enlarged. In the semiconductor module 1, the protruding portion 13 is disposed on the outer periphery 9 side face (wall face) of the molded resin 10 between the large current terminal G1 and the large current terminal B1. Herein, when looking at the creepage distance between the large current terminal G1 and the large current terminal B1, a line L1 drawn linearly between one pair of opposing corners of the large current terminal G1 and the large current terminal B1 follows a surface of the protruding portion 13, and a length thereof is greater than when there is no protruding portion 13. The length can be seen as being the creepage distance, because of which the length can be changed to a desired distance by varying the height of the protruding portion 13.

Also, a line L2 is such that terminal corner portions that are departure and arrival points are the same as for the line L1, but the line L2 is drawn around a low point of the protruding portion 13. As a length of the line L2 also needs to be such as to secure a desired creepage distance, an inclined face 7 of the protruding portion 13 needs to be determined carefully when gradually reducing the height of the protruding portion 13 from an apex portion. That is, the shortest distance between terminals not being limited to a straight line, a periphery of the recessed portion 12 or the protruding portion 13, and furthermore, the outer periphery 9 of the molded resin 10, which is a package, should also be taken into consideration.

Also, the recessed portion 12 can also be formed so as to have the smooth inclined face 7 from an innermost portion toward the outer periphery 9. By the recessed portion 12 or the protruding portion 13 being provided with the inclined face 7, there is an advantage in that die cutting for molding the molded resin 10 of the whole of the semiconductor module 1 becomes easier.

Whichever of the recessed portion 12 and the protruding portion 13 is provided in the semiconductor module 1 according to the first embodiment, there is little significant difference with respect to securing creepage distance, but the one to be provided can be selected using another condition.

For example, when the base 11 or the like is provided as far as a position in proximity to the outer periphery 9 of the molded resin 10, there is no room in which to provide the recessed portion 12, because of which a more highly reliable semiconductor module 1 is obtained by the protruding portion 13 being provided. Furthermore, when there is a need to further extend the creepage distance, the recessed portion 12 and the protruding portion 13 can be provided in combination.

According to the semiconductor module 1 of the first embodiment, as heretofore described, the recessed portion 12 or the protruding portion 13, which have a depth or a height such that creepage distance between the multiple of terminals C1 to C6, B1, B2, G1, G2, M1, and M2 is secured, and are formed so as to cross the interval 8 between the multiple of terminals C1 to C6, B1, B2, G1, G2, M1, and M2, are included in one portion of the outer periphery 9 side face of the molded resin 10 between the multiple of terminals C1 to C6, B1, B2, G1, G2, M1, and M2, whereby the reliability of the semiconductor module 1 can be increased. Also, the protruding portion 13 need not be integrated with the molded resin 10 of the semiconductor module 1, but when the protruding portion 13 is integrated, the protruding portion 13 and the molded resin 10 can be formed in the same step when molding, because of which there is an advantage in that a manufacturing process can be simplified.

Also, according to the semiconductor module 1 of the first embodiment, the spatial distance between terminals can be extended simultaneously with securing creepage distance and increasing reliability. Also, as the semiconductor module 1 is such that the space between terminals is of an uneven form in one portion of the outer periphery 9 of the molded resin 10, there is no effect on a disposition or a form of a terminal itself, because of which there is no reduction of machinability for manufacturing the semiconductor module 1, which is the device.

Second Embodiment

Figure 5A:
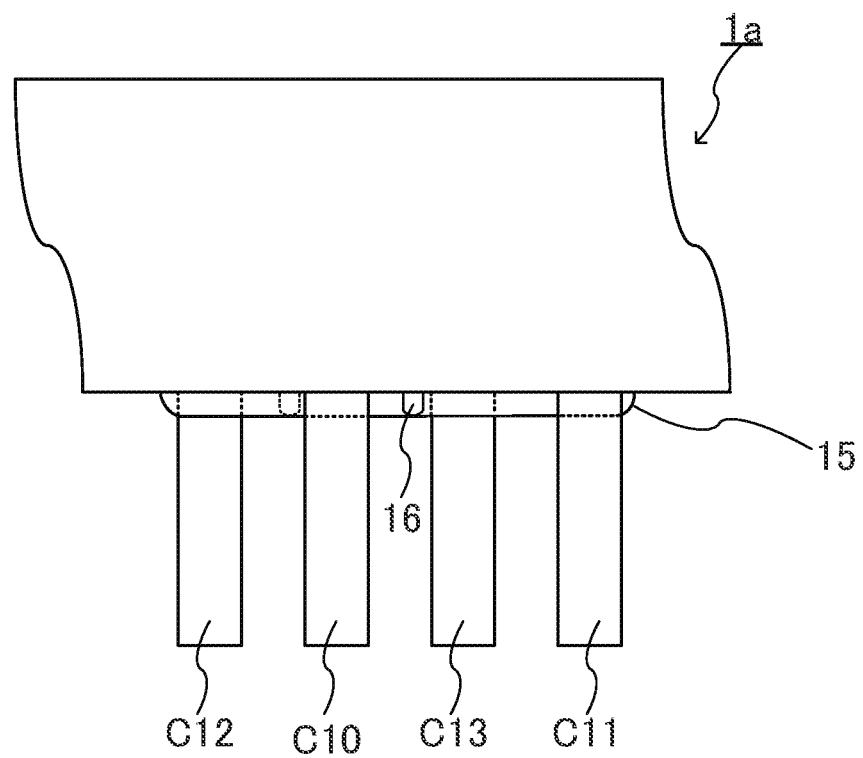
FIG. 5A is a partial top view of a semiconductor module according to a second embodiment.
Figure 5B:
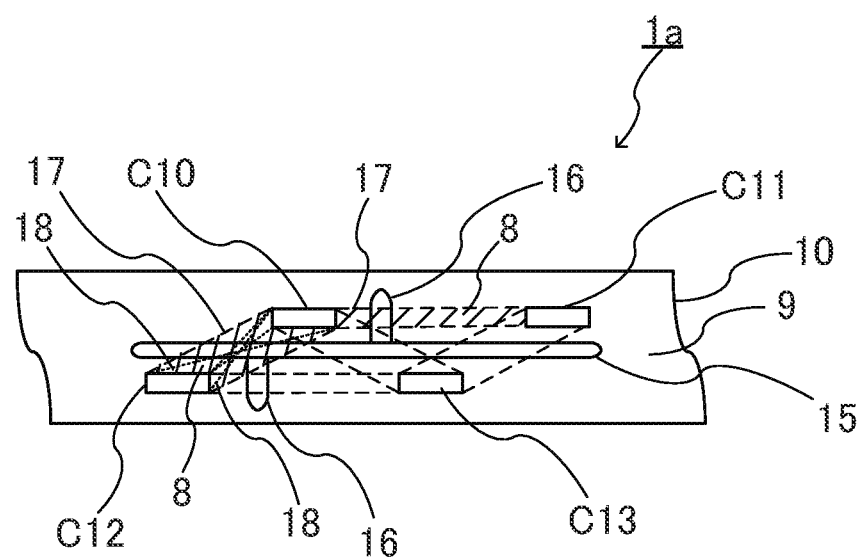
FIG. 5B is a partial side view of the semiconductor module according to the second embodiment.

FIG. 5A is a partial top view of a semiconductor module according to a second embodiment, and FIG. 5B is a partial side view of the semiconductor module according to the second embodiment. Although a circuit configuration is the same as in the first embodiment, FIG. 5A and FIG. 5B show a semiconductor module 1a of a different configuration. Herein, using FIG. 5A and FIG. 5B, a description will be given of securing creepage distance between a multiple of terminals C10 to C13.

As shown in FIG. 5B, the semiconductor module 1a in the second embodiment is such that the multiple of terminals C10 to C13 are formed disposed in a staggered form (a zigzag form) from the outer periphery 9 side face of the molded resin 10. Furthermore, not only a thickness of each terminal C10 to C13, but also a width direction of each terminal C10 to C13 contributes to the interval 8 between the terminals C10 to C13. This kind of arrangement of the multiple of terminals C10 to C13 is also such that the creepage distance is the shortest length of the interval 8 between the multiple of terminals C10 to C13, because of which the creepage distance is a straight line from each side of the terminals C10 to C13. In FIG. 5A and FIG. 5B, a broken line 18 is a multiple of lines that connect corner portions of the terminal C12 to each one corner of the terminal C10, and opposing lines 17 shown as separate broken lines correspond to the interval 8 between the terminal C10 and the terminal C12, because of which an uneven portion needs to be provided in such a way as to cross this region. That is, the interval 8 between the multiple of terminals C10 to C13 in the second embodiment is a region in a portion of an area sandwiched and enclosed by a multiple of lines connecting, at the shortest distance, arbitrary places in a periphery of neighboring terminals among the multiple of terminals C10 to C13.

FIG. 5A and FIG. 5B will be described using an example wherein a protruding portion 15 is formed in the interval 8 between the multiple of terminals C10 to C13. As shown in FIG. 5B, the interval 8 of, for example, the terminal C10 and the terminal C12 is a region in a portion of an area sandwiched and enclosed by the opposing lines 17 shown as separate broken lines, and is indicated by oblique lines. Also, the interval 8 of the terminal C10 and the terminal C13 is also a region in a portion of an area sandwiched and enclosed by the opposing lines 17 shown as separate broken lines. As shown in FIG. 5A and FIG. 5B, the semiconductor module 1a of the second embodiment is such that the protruding portion 15 is provided in the interval 8 enclosed by the opposing lines 17 shown as separate broken lines. Because of this, the protruding portion 15 is of a horizontally long form in the semiconductor module 1a of the second embodiment. Because of this, the protruding portion 15 is provided between upper and lower terminals in the semiconductor module 1a of the second embodiment.

Furthermore, a protruding portion 16 is provided between, for example, the terminal C10 and the terminal C11 or the terminal C12 and the terminal C13, which are terminals neighboring in a horizontal direction.

According to the semiconductor module 1a according to the second embodiment, as heretofore described, the protruding portion 15 or the protruding portion 16 is provided in the interval 8 between terminals, whereby creepage distance is secured. The protruding portion 15 or the protruding portion 16 is provided so as to cross (divide) the interval 8, and it is sufficient that a horizontal direction position of, in particular, the protruding portion 15 in the drawing divides the opposing lines 17, because of which there is freedom of disposition in left and right directions. Also, as the shortest distance between terminals of the protruding portion 16 is long compared with that of the protruding portion 15, a height of the protruding portion 16 can be formed to be lower than a height of the protruding portion 15.

Also, the semiconductor module 1a according to the second embodiment is also such that the protruding portion 15 or the protruding portion 16 need not be integrated with the molded resin 10 of the semiconductor module 1a, but when the protruding portion 15 or the protruding portion 16 is integrated, the protruding portion 15 or the protruding portion 16 and the molded resin 10 can be formed in the same step when molding, because of which there is an advantage in that a manufacturing process can be simplified. Also, a recessed portion (not shown) can be provided so as to divide the interval 8 between the terminals C10 to C13 in the semiconductor module 1a according to the second embodiment. The semiconductor module 1a of the second embodiment is such that a simple structure can be adopted by the form of the uneven portion being unified as far as possible as either a recessed form or a protruding form.

In the second embodiment, the interval 8 between the multiple of terminals C10 to C13 in the second embodiment is specified as being a region in a portion of an area sandwiched and enclosed by a multiple of lines connecting, at the shortest distance, arbitrary places in a periphery of neighboring terminals among the multiple of terminals C10 to C13, but it goes without saying that in the semiconductor module 1 of the first embodiment too, the interval 8 between the terminal G1 and the terminal B1 shown in, for example, FIG. 4 is a region in a portion of an area sandwiched and enclosed by a multiple of lines connecting, at the shortest distance, arbitrary places in a periphery of, for example, the terminal G1 and the terminal B1, which are a multiple of neighboring terminals.

Although the present application is described in terms of various exemplifying embodiments and implementations, it should be understood that the various features, aspects, and functionality described in one or more of the individual embodiments are not limited in their applicability to the particular embodiment with which they are described, but instead can be applied, alone or in various combinations to one or more of the embodiments.

It is therefore understood that numerous modifications that have not been exemplified can be devised without departing from the scope of the present application. For example, at least one constituent component may be modified, added, or eliminated. At least one of the constituent components in at least one of the preferred embodiments may be selected and combined with the constituent components mentioned in another preferred embodiment.

REFERENCE SIGNS LIST 1, 1a semiconductor module, 2 motor, 3 power supply, 4 ground, 7 inclined face, 8 interval, 9 outer periphery, 10 molded resin, 11 base, 12 recessed portion, 12a broken line, 13, 15, 16 protruding portion, 17 opposing line, 18 broken line, C1, C2, C3, C4, C5, C6, C10, C11, C12, C13, B1, B2, G1, G2, M1, M2 terminal, T1, T2, T3, T4 semiconductor switching element

The invention claimed is:

1. A semiconductor module, comprising:
a semiconductor switching element;
a plurality of bases, on at least one of which the semiconductor switching element is mounted;
a molded resin that seals the semiconductor switching element and the plurality of bases;
a plurality of terminals formed integrally with each one of the plurality of bases and provided extending from an outer periphery side face of the molded resin; and
a recessed portion or a protruding portion having a depth or a height such that creepage distance between the plurality of terminals is secured, and formed so as to cross an interval between the plurality of terminals, in one portion of the outer periphery side face of the molded resin between the plurality of terminals,
wherein the plurality of terminals are disposed in a zigzag pattern from the outer periphery side face of the molded resin, the recessed portion or the protruding portion is provided between upper and lower terminals among the plurality of terminals that are disposed in the zigzag pattern and has a first portion that is of a horizontally long form, each of the plurality of terminals is not in contact with the recessed portion or the protruding portion.

2. The semiconductor module according to claim 1, wherein the recessed portion or the protruding portion is of the same material as the molded resin, and there is a gap so that the plurality of terminals and the recessed portion or the protruding portion do not come into contact.

3. The semiconductor module according to claim 2, wherein the protruding portion is of a raised form formed in a direction of extension of the terminal.

4. The semiconductor module according to claim 2, wherein the recessed portion is bored in a semi-circular form out of the outer periphery side face of the molded resin.

5. The semiconductor module according to claim 2, wherein the recessed portion or the protruding portion has an inclined face.

6. The semiconductor module according to claim 2, wherein
the recessed portion or the protruding portion is disposed between the plurality of terminals so that the recessed portion or the protruding portion intersects, when viewed from a direction toward the outer periphery side face, virtual lines that are shortest distances between each of neighboring terminals among the plurality of terminals that are disposed in the zigzag pattern.

7. The semiconductor module according to claim 1, wherein the protruding portion is of a raised form formed in a direction of extension of the terminal.

8. The semiconductor module according to claim 7, wherein the recessed portion or the protruding portion has an inclined face.

9. The semiconductor module according to claim 7, wherein
the recessed portion or the protruding portion is disposed between the plurality of terminals so that the recessed portion or the protruding portion intersects, when viewed from a direction toward the outer periphery side face, virtual lines that are shortest distances between each of neighboring terminals among the plurality of terminals that are disposed in the zigzag pattern.

10. The semiconductor module according to claim 1, wherein the recessed portion is bored in a semi-circular form out of the outer periphery side face of the molded resin.

11. The semiconductor module according to claim 10, wherein the recessed portion or the protruding portion has an inclined face.

12. The semiconductor module according to claim 10, wherein
the recessed portion or the protruding portion is disposed between the plurality of terminals so that the recessed portion or the protruding portion intersects, when viewed from a direction toward the outer periphery side face, virtual lines that are shortest distances between each of neighboring terminals among the plurality of terminals that are disposed in the zigzag pattern.

13. The semiconductor module according to claim 1, wherein the recessed portion or the protruding portion has an inclined face.

14. The semiconductor module according to claim 13, wherein
the recessed portion or the protruding portion is disposed between the plurality of terminals so that the recessed portion or the protruding portion intersects, when viewed from a direction toward the outer periphery side face, virtual lines that are shortest distances between each of neighboring terminals among the plurality of terminals that are disposed in the zigzag pattern.

15. The semiconductor module according to claim 1, wherein the recessed portion or the protruding portion is disposed between the plurality of terminals so that the recessed portion or the protruding portion intersects, when viewed from a direction toward the outer periphery side face, virtual lines that are shortest distances between each of neighboring terminals among the plurality of terminals that are disposed in the zigzag pattern.

16. The semiconductor module according to claim 1, wherein the recessed portion or the protruding portion has a second portion that is provided between the terminals neighboring in a horizontal direction among the plurality of terminals that are disposed in the zigzag pattern.

17. The semiconductor module according to claim 1, wherein
the recessed portion or the protruding portion is disposed between the plurality of terminals so that the recessed portion or the protruding portion intersects, when viewed from a first direction toward the outer periphery side face, virtual lines that are shortest distances between each of neighboring terminals among the plurality of terminals that are disposed in the zigzag pattern, and
the recessed portion or the protruding portion comprises:
the first portion, the first portion being a protrusion or a recess that extends in a second direction, that is perpendicular to the first direction, such as to be disposed between first neighboring terminals of the plurality of terminals and second neighboring terminals of the plurality of terminals in a third direction that is perpendicular to the first direction and the second direction,
a second portion that is a protrusion or a recess that extends from the first portion in the third direction, such as to be disposed between the first neighboring terminals, and
a third portion that is a protrusion or a recess that extends from the first portion in a fourth direction that is opposite to the third direction, such as to be disposed between the second neighboring terminals.

18. The semiconductor module according to claim 17, wherein
the first portion comprises a first edge and a second edge that extend in the second direction and are ends of the first portion in the third direction and the fourth direction, respectively,
the second portion comprises a first edge and a second edge that extend in the third direction and that are ends of the second portion in the second direction and a direction opposite to the second direction, respectively, and
the third portion comprises a first edge and a second edge that extend in the third direction and are ends of the third portion in the second direction and the direction opposite to the second direction, respectively.

* * * * *